(12) United States Patent
Wakana et al.

(10) Patent No.: US 9,510,438 B2
(45) Date of Patent: Nov. 29, 2016

(54) ELECTRONIC CONTROL DEVICE

(71) Applicant: HITACHI AUTOMOTIVE SYSTEMS, LTD., Ibaraki (JP)

(72) Inventors: Yoshinori Wakana, Hitachinaka (JP); Takeshi Igarashi, Hitachinaka (JP); Yasuro Kameshiro, Hitachinaka (JP); Takashi Hattori, Hitachinaka (JP); Masaru Kamoshida, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 14/438,970

(22) PCT Filed: Oct. 25, 2013

(86) PCT No.: PCT/JP2013/078897
§ 371 (c)(1),
(2) Date: Apr. 28, 2015

(87) PCT Pub. No.: WO2014/069340
PCT Pub. Date: May 8, 2014

(65) Prior Publication Data
US 2015/0289357 A1 Oct. 8, 2015

(30) Foreign Application Priority Data

Nov. 2, 2012 (JP) ................................. 2012-242949

(51) Int. Cl.
*H05K 5/00* (2006.01)
*H05K 1/02* (2006.01)
(Continued)

(52) U.S. Cl.
CPC ............. *H05K 1/0204* (2013.01); *H01L 23/36* (2013.01); *H05K 1/181* (2013.01); *H05K 5/006* (2013.01);
(Continued)

(58) Field of Classification Search
CPC .............................................. H05K 2201/066
See application file for complete search history.

(56) References Cited

U.S. PATENT DOCUMENTS 5,467,251 A * 11/1995 Katchmar ........... H01L 23/3672
174/252
5,617,294 A * 4/1997 Watson ............... H01L 21/4882
174/16.3
(Continued)

FOREIGN PATENT DOCUMENTS

JP 7-321486 A 12/1995
JP 9-18176 A 1/1997
(Continued)

OTHER PUBLICATIONS

International Search Report (PCT/ISA/210) dated Feb. 4, 2014, with English translation (eight (8) pages).

*Primary Examiner* — Hung V Ngo
(74) *Attorney, Agent, or Firm* — Crowell & Moring LLP

(57) ABSTRACT

The invention provides an electronic control device having a high-grade heat sink that: does not require tight control at the time of manufacturing; is structurally simple; can be produced at a higher production rate; and is cost-effective. In this device, when a circuit board 14 having an electronic component 13 thereon is placed in a non-metal (resin) housing having: a housing base 11 integrally comprising via a partition wall 11e a connector inserting section 18 used for electrical connection with an external mating connector (not illustrated); and a housing cover 12 attached to the housing base 11, part of the board 14 is inserted into an insertion hole provided in the partition wall 11e so that it is exposed inside the connector inserting section 18. When a convex-shaped metal part 15, used as a heat sink, having a flange 15a on the bottom side is attached from an opening provided in the housing base 11, the top section of the metal part 15 comes into contact with mounting position of the electronic component 13 on the board 14 via a heat dissipating filler material 16, and the flange 15a and the wall section near the opening are brought into contact with each other via a sealing filler material 17.

18 Claims, 11 Drawing Sheets

(51) Int. Cl.
  *H05K 7/14* (2006.01)
  *H05K 7/20* (2006.01)
  *H01L 23/36* (2006.01)
  *H05K 1/18* (2006.01)
  *H01L 23/42* (2006.01)

(52) U.S. Cl.
  CPC ............ H05K 5/0034 (2013.01); H05K 7/142 (2013.01); H05K 7/2039 (2013.01); H05K 7/20854 (2013.01); *H01L 23/42* (2013.01); *H01L 2924/0002* (2013.01); *H05K 2201/066* (2013.01)

(56) References Cited

U.S. PATENT DOCUMENTS

| | | | | |
|---|---|---|---|---|
| 5,646,826 | A * | 7/1997 | Katchmar | H01L 23/4006 165/185 |
| 6,156,980 | A * | 12/2000 | Peugh | H01L 23/3677 174/252 |
| 6,163,456 | A * | 12/2000 | Suzuki | H05K 1/141 174/16.3 |
| 6,190,941 | B1 * | 2/2001 | Heinz | H01L 23/3677 438/106 |
| 8,531,024 | B2 * | 9/2013 | Lin | H01L 21/486 257/706 |
| 2005/0108877 | A1 * | 5/2005 | Peterson | B23P 11/00 29/890.03 |
| 2005/0270753 | A1 | 12/2005 | Morisada | |
| 2006/0012034 | A1 * | 1/2006 | Kadoya | H05K 1/0203 257/712 |
| 2006/0018098 | A1 * | 1/2006 | Hill | H05K 1/0204 361/708 |
| 2006/0043581 | A1 * | 3/2006 | Prokofiev | H05K 1/141 257/713 |
| 2014/0291843 | A1 * | 10/2014 | Jiang | H01L 23/49816 257/738 |
| 2015/0366047 | A1 * | 12/2015 | Okasaka | H05K 1/021 361/749 |

FOREIGN PATENT DOCUMENTS

| | | |
|---|---|---|
| JP | 2005-38975 A | 2/2005 |
| JP | 2005-142349 A | 6/2005 |
| JP | 2006-19674 A | 1/2006 |
| JP | 2008-34474 A | 2/2008 |
| JP | 2008-71854 A | 3/2008 |
| JP | 2009-123812 A | 6/2009 |
| JP | 2011-119503 A | 6/2011 |
| JP | 2012-195525 A | 10/2012 |

* cited by examiner

ELECTRONIC CONTROL DEVICE

TECHNICAL FIELD

The present invention relates to an electronic control device having a heat sink for efficiently dissipating heat from the electronic component mounted on the circuit board housed in the device.

BACKGROUND ART

Conventionally, an example of known techniques related to the heat sink structure applied to electronic control devices of this kind is "housing having a built-in circuit board" (see Patent Document 1) in which part of a heat dissipating fin is exposed from part of the housing, the circuit board having an electronic component thereon is provided so as to touch the heat dissipating fin via a heat dissipating sheet, and the circuit board, the heat dissipating sheet, and the heat dissipating fin are integrally formed with the housing by sealing them with sealing plastic by insert molding or the like.

Another known technique related to similar heat sink structures is "electric component casing structure" (see Patent Document 2) in which an electric component casing for housing a circuit board having an electronic electric component thereon in a sealed manner is constructed by a dual-layer structure comprising a resin casing section formed of resin and a metal casing section formed of metal, and the resin casing section and the metal casing section are integrally formed by outsert molding or insert molding.

PRIOR ART DOCUMENTS

Patent Documents

Patent Document 1: JP-1997-18176-A
Patent Document 2: JP-2008-71854-A

SUMMARY OF THE INVENTION

Problems to be Solved by the Invention

According to the technique of Patent Document 1 the circuit board having the electronic component thereon and part of the heat dissipating fin exposed to the outside of the housing need to be sealed within the housing with the use of sealing plastic. Thus, tight standards control is necessary to ensure the reliability of the basic operation of the electronic components and the connection of the printed circuit boards at the time of manufacturing, and temperature and time need to be controlled tightly in the manufacturing environment to perform quality control. This results in a cost increase and lower productivity.

In the technique of Patent Document 2, the electric component casing is constructed by the dual-layer structure comprising the resin casing section and the metal casing section. Thus, at the time of manufacturing, materials of different heat transfer rates need to be formed integrally without causing deformation, in an accurate manner, and according to the standard dimensions. Accordingly, similar to the above, temperature and time need to be controlled tightly in the manufacturing environment to perform quality control. This results in a cost increase and lower productivity.

The present invention has been made to solve the above problems, and its object is to provide an electronic control device having a high-grade heat sink that: does not require tight control at the time of manufacturing; is structurally simple; can be produced at a higher production rate; and is cost-effective.

Means for Solving the Problems

To solve the above technical problems, one fundamental structure of the invention is an electronic control device housing a circuit board having an electronic component thereon in a housing of the device, wherein a wall surface of the housing facing the mounting position of the electronic component on the circuit board is partially open and a convex-shaped heat dissipating metal part having a flange on its bottom side is attached to the opening from outside, and wherein a to section of the metal part comes into contact with the position on the circuit board corresponding to the mounting position of the electronic component with a heat dissipating filler material placed therebetween when the metal part is attached from the opening of the housing and the flange and a wall section near the opening are brought into contact with each other with a sealing filler material placed therebetween.

Another structure of the invention is an electronic control device housing a circuit board having an electronic component thereon in a housing of the device, wherein a wall surface of the housing facing the mounting position of the electronic component on the circuit board is partially open and a convex-shaped heat dissipating metal part having a flange on its bottom side is attached to the opening from outside, and wherein a top section of the metal part comes into contact with the electronic component on the circuit board with a heat dissipating filler material placed therebetween when the metal part is attached from the opening of the housing and the flange and a wall section near the opening are brought into contact with each other with a sealing filler material placed therebetween.

Effects of the Invention

In accordance with the invention, when the metal part used as a heat sink is attached to the opening of the housing, the top section of the metal part comes into contact with the position on the circuit board corresponding to the mounting position of the electronic component or the electronic component itself with the heat dissipating filler material provided therebetween, and the flange on the bottom side of the metal part and a wall section near the opening are brought into contact with each other with a sealing filler material provided therebetween. Accordingly, the heat of the electronic component is transferred from the electronic component itself and its nearby area to the heat dissipating filler material and the metal part, thereby efficiently dissipating it to the outside. Thus, the invention can provide a high-grade heat sink that: does not require tight control at the time of manufacturing; is structurally simple; can be produced at a higher production rate; is cost-effective; and has sufficient sealability (waterproof properties).

MODE FOR CARRYING OUT THE INVENTION

Electronic control devices according to embodiments of the invention will now be described with reference to the accompanying drawings.

Embodiment 1

Figure 1:
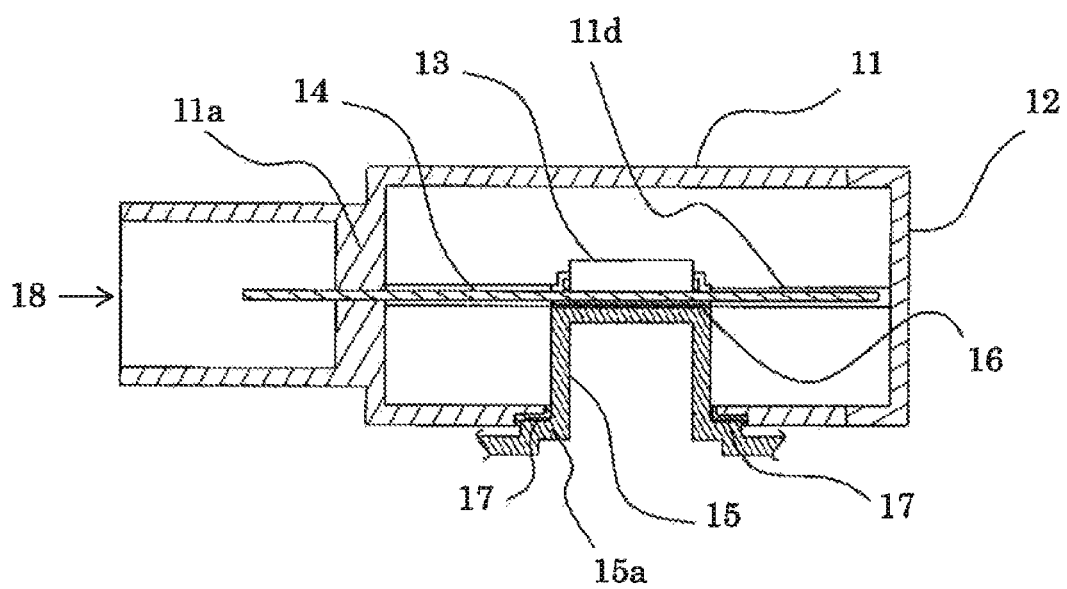
FIG. 1 is a cross-sectional side view illustrating the fundamental structure of an electronic control device according to Embodiment 1 of the invention.

FIG. 1 is a cross-sectional side view illustrating the fundamental structure of an electronic control device according to Embodiment 1 of the invention. The electronic control device has the fundamental structure in which a circuit board 14 having an electronic component 13 thereon is placed in a non-metal (resin) housing having: a housing base 11 integrally comprising a partition wall 11a a connector inserting section 18 that allows the insertion of a male connector used for electrical connection with an external mating connector (female connector) not illustrated; and a housing cover 12 attached to the housing base 11. In addition, the device has the heat sink structure in which when a convex-shaped plate-like metal part 15 having a flange 15a on the bottom side is attached to an opening provided in the housing base 11, the top section of the metal part 15 comes into-contact with the position of the bottom surface of the circuit board 14 corresponding to the mounting position of the electronic component 13 is a heat dissipating filler material 16, and the flange 15a and the wall section near the opening are brought into contact via a sealing filler material 17. Also, inside the connector inserting section 18, an edge of the circuit board 14 is inserted into an insertion hole provided in the partition wall 11a, and part of the electric connection pattern on it is exposed.

Among these components, the housing base 11 integrally having the connector inserting section 18 and the partition wall 11a is open on the edge side across from the partition wall 11a. The housing cover 12 is attached to the opening of the housing base 11 on that edge side. An external mating connector to be used for the connector inserting section 18 is a female card-edge connector to be connected to the terminal of the circuit board 14. A wall surface of the housing base 11 across from the position on the bottom surface of the circuit board 14 corresponding to the mounting position of the electronic component 13 on the top surface which requires heat dissipation is partially open, and the metal part 15 can be attached to the opening from outside. At this time, to perform connection with the bottom surface of the circuit board 14 for the purposes of heat dissipation, a heat dissipating adhesive which serves as the heat dissipating filler material 16 is applied to the corresponding position on the bottom surface of the circuit board 14 or to the top section of the metal part 15. In addition, to ensure waterproof properties, an adhesive having sealability which serves as the sealing filler material 17 is applied to the wall near the opening of the housing base 11 or to the contact surface side of the flange of the metal part 15 which comes into contact with the wall near the opening. In this way, by attaching the metal part 15 to the opening of the housing base 11 by increasing heat dissipating capabilities and sealability, the heat of the electronic component 13 can be transferred from the bottom surface of the circuit board 14 via the heat dissipating filler material 16 to the metal part 15, thereby efficiently dissipating the heat to the outside. As to the heat dissipating filler material 16 and the sealing filler material 17, different adhesive materials are used or a single adhesive material can instead be used to reduce the types of adhesive materials used.

Figure 2:
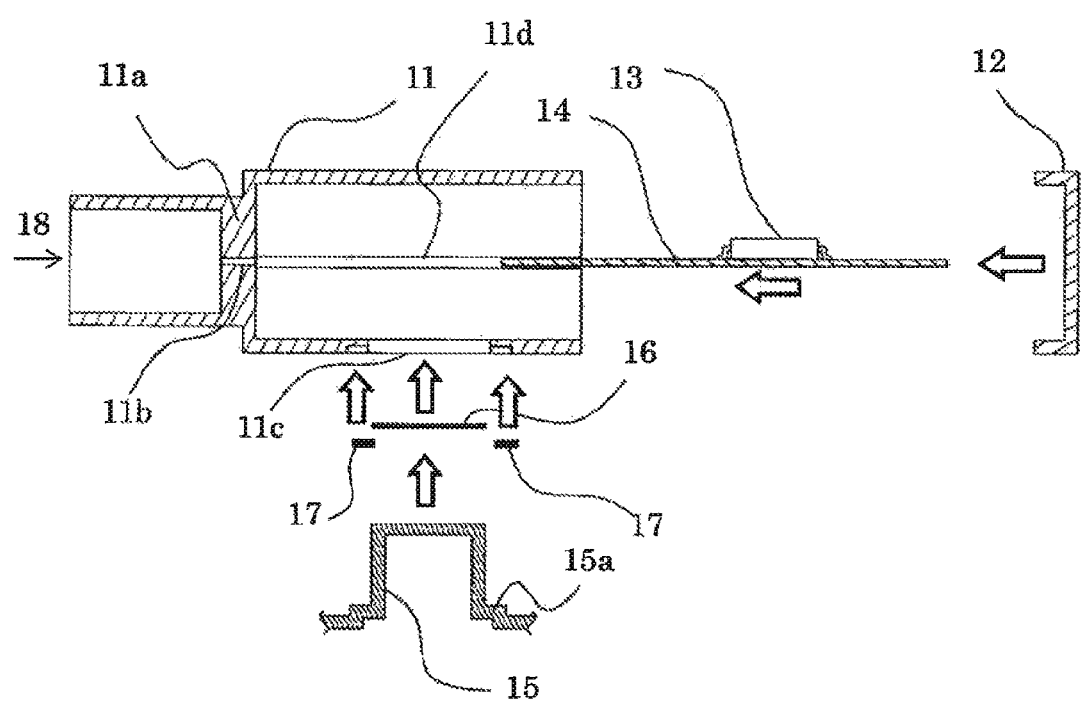
FIG. 2 is an exploded view of the electronic control device of FIG. 1.

FIG. 2 is an exploded view of the electronic control device of Embodiment 1. FIG. 2 illustrates the assembly method in which when the circuit board 14 having the electronic component 13 thereon is inserted into the housing, the circuit board 14 having the electronic component 13 thereon is slid inside the housing base 11 to insert an edge of the circuit board 14 into the insertion hole 11b of the partition wall 11a so that part of the circuit board 14 is exposed inside the connector inserting section 18, the housing cover 12 is then attached to the housing base 11, and the metal part 15 is attached by the heat dissipating filler material 16 and the sealing filler material 17 to the opening 11c of the housing base 11 provided for attachment of the metal part 15. The inner side walls of the housing base 11 include guide grooves 11d that support the two lateral edges of the circuit board 14 when the circuit board 14 is slid into the housing base 11.

As stated above, an external mating connector to be used for the connector inserting section 18 is a female card-edge connector. However, the device can be formed into a type in which a connector of the same structure is mounted on the circuit board 14. In such a case, as will be described in the embodiments that follow, the housing base 11 need not have the section integrally having the connector inserting section 18 via the partition wall 11a. Also, the housing cover 12 is preferably formed of resin, but it can also be formed of metal. When the metal part 15 is attached to the housing base 11 from outside, the metal part 15 is bonded to the housing base 11 after adhesives are applied onto the corresponding position on the bottom surface of the circuit board 14, the wall near the opening of the housing base 11, and the top section and the flange 15a of the metal part 15.

In the heat sink structure of the electronic control device of Embodiment 1, when the convex-shaped and plate-like metal part 15 having the flange 15a on the bottom side is attached to the opening 11c of the housing base 11, the top section of the metal part 15 comes into contact with the position of the bottom surface of the circuit board 14 corresponding to the mounting position of the electronic component 13 via the heat dissipating filler material 16, and the flange 15a and the wall section near the opening 11c are brought into contact via the sealing filler material 17. Accordingly, because the heat of the electronic component 13 can be transferred from the bottom surface of the circuit board 14 via the heat dissipating filler material 16 to the metal part 15 to efficiently dissipate it to the outside, Embodiment 1 offers a high-grade heat sink that: does not require tight control at the time of manufacturing; is structurally simple; can be produced at a higher production rate; is cost-effective; and has sufficient sealability (waterproof properties).

Embodiment 2

Figure 3:
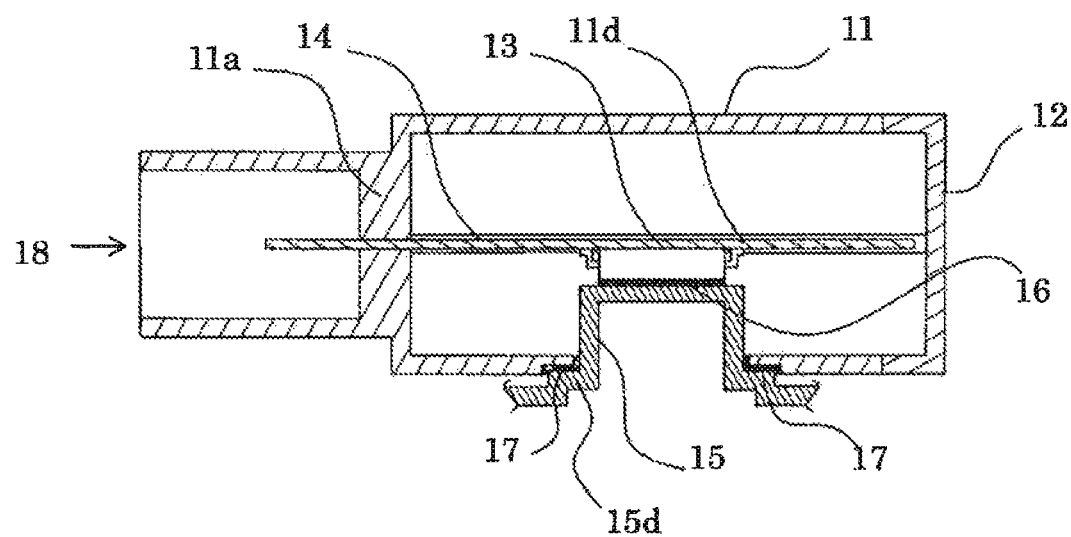
FIG. 3 is a cross-sectional side view illustrating the fundamental structure of an electronic control device according to Embodiment 2 of the invention.

FIG. 3 is a cross-sectional side view illustrating the fundamental structure of an electronic control device according to Embodiment 2 of the invention. The electronic control device of Embodiment 2 differs from that of Embodiment 1 shown in FIG. 1 in that when the circuit board 14 having the electronic component 13 thereon is slid into the housing base 11 to insert an edge section of the circuit board 14 into the insertion hole 11b of the partition wall 11a, the circuit board 14 is inserted upside down, part of the circuit board 14 is exposed inside the connector inserting section 18 such that the electronic component 13 faces downward, and the heat of the electronic component 13 is transferred directly through the heat dissipating filler material 16 to the metal part 15 to efficiently dissipate it to the outside.

In the heat sink structure of the electronic control device of Embodiment 2, when the convex-shaped and plate-like metal part 15 having the flange 15a on the bottom side is attached to the opening 11c of the housing base 11, the too section of the metal part 15 comes into contact with the electronic component 13 itself on the surface of the circuit board 14 via the heat dissipating filler material 16, and the flange 15a and the wall section near the opening 11c are brought into contact via the sealing filler material 17. Accordingly, because the heat of the electronic component 13 can be transferred directly via the heat dissipating filler material 16 to the metal part 15 to efficiently dissipate it to the outside, Embodiment 2 offers a higher-grade heat sink than that of Embodiment 1 that: does not require tight control at the time of manufacturing; is structurally simple; can be produced at a higher production rate; and is cost-effective. As to sealability, effects similar to those of Embodiment 1 can be obtained.

Embodiment 3

Figure 4:
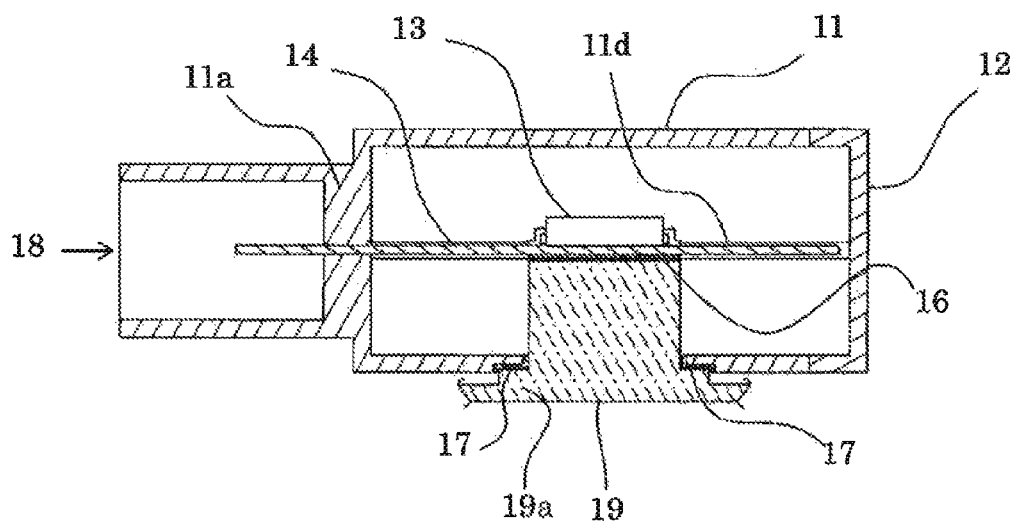
FIG. 4 is a cross-sectional side view illustrating the fundamental structure of an electronic control device according to Embodiment 3 of the invention.

FIG. 4 is a cross-sectional side view illustrating the fundamental structure of an electronic control device according to Embodiment 3 of the invention. The electronic control device of Embodiment 3 differs from that of Embodiment 1 shown in FIG. 1 in that a convex-shaped and block-shaped metal block part 19 having a flange 19a on the bottom side which is formed by aluminum die-casting is used in place of the convex-shaped metal part 15 having the flange on the bottom side which is formed by pressing.

In the heat sink structure of the electronic control device of Embodiment 3 as well, when the convex-shaped and block-shaped metal block part 19 having the flange 19a on the bottom side is attached to the opening of the housing base 11, the top section of the metal block part 19 comes into contact with the position of the bottom surface of the circuit board 14 corresponding to the mounting position of the electronic component 13 via the heat dissipating filler material 16, and the flange 19a and the wall section near the opening 11c are brought into contact via the sealing filler material 17. Accordingly, because the heat of the electronic component 13 can be transferred from the bottom surface of the circuit board 14 via the heat dissipating filler material 16 to the metal block part 19 to efficiently dissipate it to the outside, Embodiment 3 offers a high-grade heat sink that: does not require tight control at the time of manufacturing; is structurally simple; can be produced at a higher production rate; is cost-effective; and has sufficient sealability, as is similar to Embodiment 1. It should be noted that the heat sink structure of Embodiment 3 can also be applied to a structure such as the one shown in FIG. 3 in which the circuit board 14 is placed upside down in the housing so that the electronic component 13 faces downward.

Embodiment 4

Figure 5:
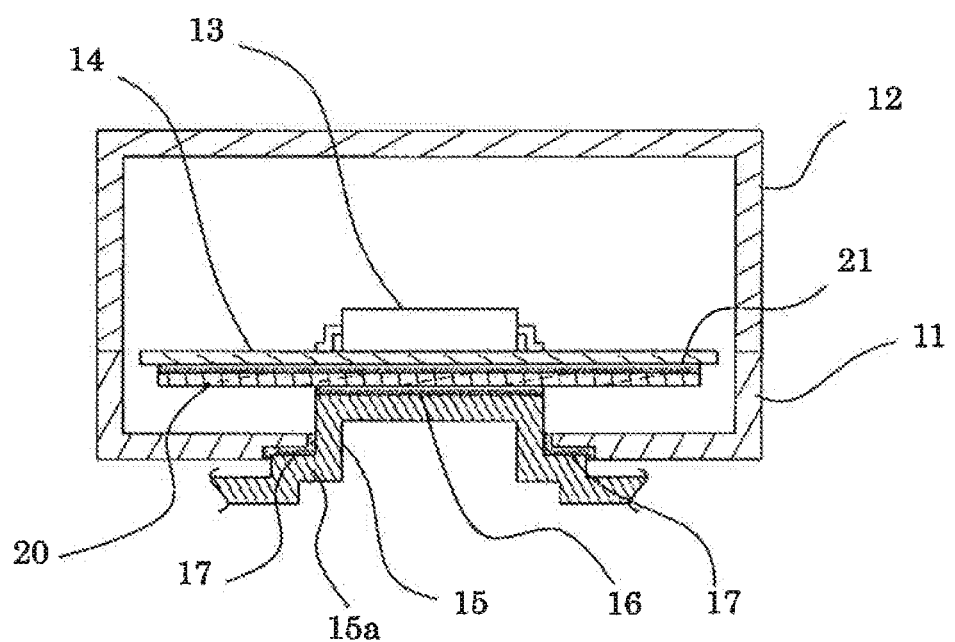
FIG. 5 is a cross-sectional side view illustrating the fundamental structure of an electronic control device according to Embodiment 4 of the invention.

FIG. 5 is a cross-sectional side view illustrating the fundamental structure of an electronic control device according to Embodiment 4 of the invention. The electronic control device of Embodiment 4 differs from that of Embodiment 1 shown in FIG. 1 in that it does not include the connector inserting section 18 used for an external mating connector and the partition wall 11a, in that the housing cover 12 on one side is attached to the housing base 11 not having the guide groove 11d on the other side to assemble the housing, in that a metal heat sink plate 20 used as a heat sink is placed between the heat dissipating filler material 16 and the position on the bottom surface of the circuit board 14 corresponding to the mounting position of the electronic component 13, and in that the heat sink plate 20 is connected by an adhesive filler material 21 at the adjacent position including the terminal of the electronic component 13 on the bottom surface of the circuit board 14.

In the heat sink structure of the electronic control device of Embodiment 4, because the heat sink plate 20 is placed between the heat dissipating filler material 16 and the position on the bottom surface of the circuit board 14 corresponding to the mounting position of the electronic component 13 and the heat sink plate 20 is connected by the adhesive filler material 21 at the adjacent position including the terminal of the electronic component 13 on the bottom surface of the circuit board 14, the circuit board 14 and the filler material 21 can be connected in a wider area, and the filler material 21 and the heat sink plate 20 can receive the heat of the electronic component 13 in a wider area, thereby transferring it to the metal part 15 to dissipate it to the outside. Thus, similar to the previous embodiments, Embodiment 4 results in a heat sink that: does not require tight control at the time of manufacturing; is structurally simple; can be produced at a higher production rate; is cost-effective; has higher-grade heat dissipating capabilities than Embodiment 1; and has sea ability effects similar to those of Embodiment 1. As to the filler material 21, similar to the heat dissipating filler material 16 and the sealing filler material 17, different adhesive materials are used or a single adhesive material can instead be used. It should be noted that the heat sink structure of Embodiment 4 can also be applied to a structure such as the one shown in FIG. 3 in which the circuit board 14 is placed upside down in the housing so that the electronic component 13 faces downward.

Embodiment 5

Figure 6:
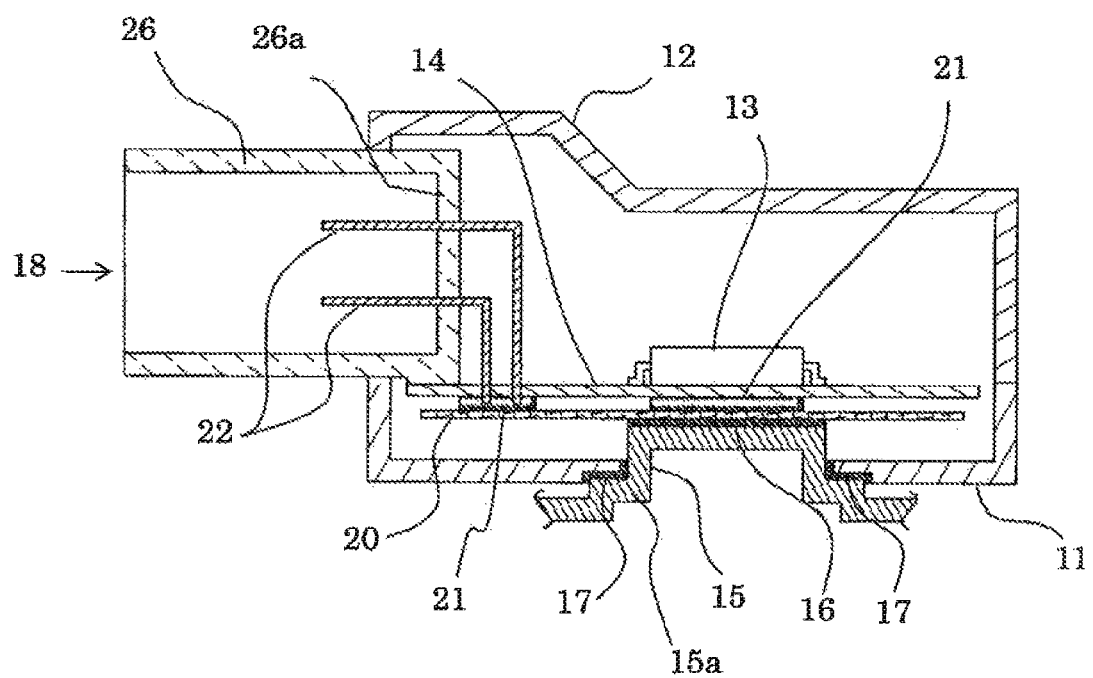
FIG. 6 is a cross-sectional side view illustrating the fundamental structure of an electronic control device according to Embodiment 5 of the invention.

FIG. 6 is a cross-sectional side view illustrating the fundamental structure of an electronic control device according to Embodiment 5 of the invention. The electronic control device of Embodiment 5 differs from that of Embodiment 1 shown in FIG. 1 in that the housing is constructed by: an opening member 26 integrally having the connector insertion section 18 and a partition wall 26a; the housing cover 12 attached from above to the housing base 11 in such a way as to sandwich the middle section of the opening member 26; and the housing base 11 without the guide grooves 11d, in that the distal ends of multiple terminals 22 inserted into the insertion hole of the partition wall 26a are exposed inside the connector inserting section 18, with the other ends of the terminals 22 being connected to a particular wiring pattern on the circuit board 14, in that the heat sink plate 20 used as a heat sink is placed between the heat dissipating filler material 16 and the position on the bottom surface of the circuit board 14 corresponding to the mounting position of the electronic component 13, and in that the heat sink plate 20 is connected by the adhesive filler material 21 at the adjacent position including the terminals 22 connected to the particular wiring pattern on the circuit board 14 and at the adjacent position including the terminal of the electronic component 13.

When the structure of Embodiment 5 is assembled, the distal ends of the terminals 22 are inserted into the insertion hole of the partition wall 26a of the opening member 26 to expose the distal ends inside the connector inserting section 18, the other ends of the terminals 22 are then connected to the wiring pattern on the circuit board 14 having the electronic component 13 thereon, these components are then positioned properly inside the housing base 11, and the metal part 15 is then attached to the opening of the housing base 11 provided for attachment of the metal part 15. In this case, an adhesive which serves as the filler material 21 is applied to the adjacent position including the terminals 22 connected to the particular wiring pattern on the circuit board 14 and to the adjacent position including the terminal of the electronic component 13, thereby connecting the metal part to the circuit board 14 with the heat sink plate 20 placed therebetween. In addition, adhesives which serve as the heat dissipating filler material 17 and the sealing material 17 are applied to the top section of the metal part 15 and the wall section near the opening 11c of the housing base 11, and the housing cover 12 is then attached to the housing base 11 and the opening member 26. The filler material 21 can be changed depending on joint sections.

In the heat sink structure of the electronic control device of Embodiment 5, efficient heat dissipation can be achieved not only at the adjacent section including the terminal of the electronic component 13 on the bottom surface of the circuit board 14 but also at the other ends of the terminals 22 connected to the particular wiring pattern on the circuit board 14 and exposed inside the connector inserting section 18 of the opening member 26. Thus, similar to the previous embodiments, Embodiment 5 results in a heat sink that: does not require tight control at the time of manufacturing; is structurally simple; can be produced at a higher production rate; is cost-effective; has higher-grade heat dissipating capabilities than Embodiment 1; and has sealability effects similar to those of Embodiment 1. As to the filler material 21, similar to the heat dissipating filler material 16 and the sealing filler material 17, a single adhesive material can instead be used. It should be noted that the heat sink structure of Embodiment 5 can also be applied to a structure such as the one shown in FIG. 3 in which the circuit board 14 is placed upside down in the housing so that the electronic component 13 faces downward.

Embodiment 6

Figure 7:
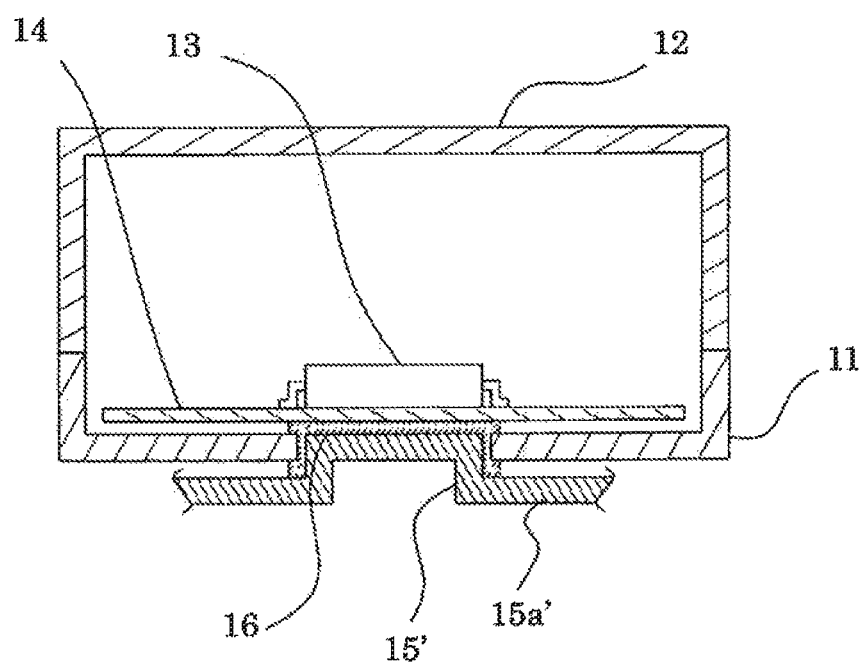
FIG. 7 is a cross-sectional side view illustrating the fundamental structure of an electronic control device according to Embodiment 6 of the invention.

FIG. 7 is a cross-sectional side view illustrating the fundamental structure of an electronic control device according to Embodiment 6 of the invention. The electronic control device of Embodiment 6 differs from that of Embodiment 1 shown in FIG. 1 in that the housing cover 12 on one side is attached to the housing base 11 not having the guide groove 11d on the other side and not having the connector inserting section 18 used for an external mating connector and the partition wall 11a to assemble the housing, in that the same adhesive is used as the heat dissipating filler material 16 and the sealing filler material 17 when a convex-shaped metal part 15' having a flange 15a' on the bottom side is attached from the opening 11c of the housing base 11, whereby the heat dissipating filler material 16 applied to the top section of the metal part 15' and the position on the bottom surface of the circuit board 14 corresponding to the mounting position of the electronic component 13 is continuous with the heat dissipating filler material 16 used also for sealing applied to the flange 15a' and the wall section near the opening 11c, and in that the metal part 15' has a smaller height.

In the heat sink structure of the electronic control device of Embodiment 6, the application range of the heat dissipating filler material 16 applied to the top section of the metal part 15' and the position on the bottom surface of the circuit board 14 corresponding to the mounting position of the electronic component 13 and the application range of the heat dissipating filler material 16 applied to the flange 15a' of the metal part 15' and the wall section near the opening 11c are put together into a single application range, and the single heat dissipating adhesive material, which can be used also for sealing, is applied in a single application process. Accordingly, Embodiment 6 results in a heat sink that is structurally simpler, can be produced at a higher production rate, and is more cost-effective than in Embodiment 1 and has sufficient sealability effects similar to those of Embodiment 1. It should be noted that the heat sink structure of Embodiment 6 can also be applied to a structure such as the one shown in FIG. 3 in which the circuit board 14 is placed upside down in the housing so that the electronic component 13 faces downward.

Embodiment 7

Figure 8:
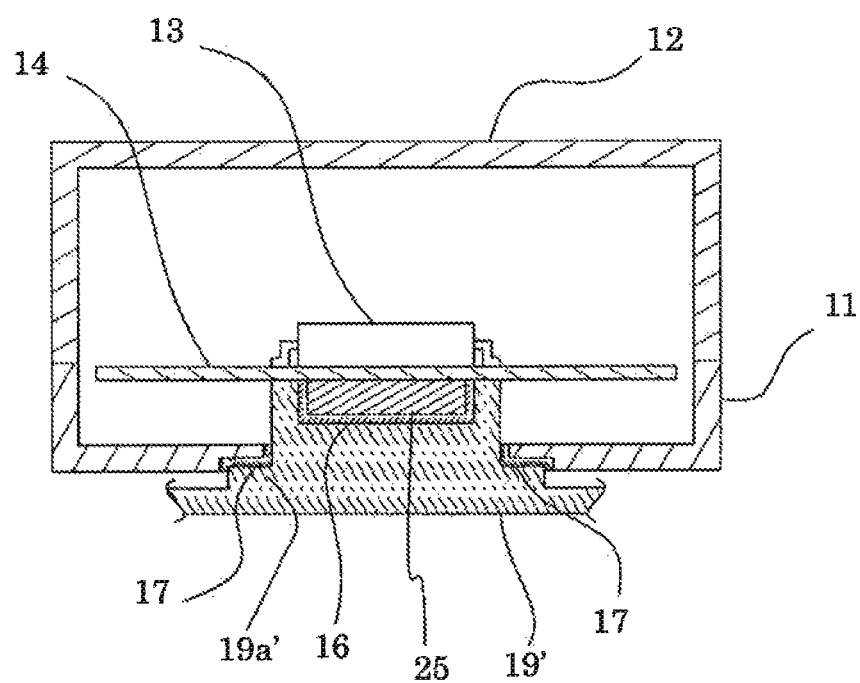
FIG. 8 is a cross-sectional side view illustrating the fundamental structure of an electronic control device according to Embodiment 7 of the invention.

FIG. 8 is a cross-sectional side view illustrating the fundamental structure of an electronic control device according to Embodiment 7 of the invention. The electronic control device differs from that of Embodiment 3 shown in FIG. 4 in that a concave section is provided at the top of a convex-shaped and block-shaped metal block part 15 having a flange 19a' and in that an adhesive is applied as the heat dissipating filler material 16 to the wall section near the concave section or to the outer walls of a heat sink block part 25 to be housed in the concave section to fix the heat sink block part 25 to the concave section, or solder is applied as the heat dissipating filler material 16 to the wall section near the concave section to fix the heat sink block part 25.

In the heat sink structure of the electronic control device of Embodiment 7, since the heat sink block part 25 is attached to the concave section of the metal block part 19' is the heat dissipating filler material 16, the metal block part 19' can sufficiently transfer the heat of the electronic component 13 also from the lateral surfaces of the concave section, and the surface from which the metal block part 19' transfers the heat becomes wider than in Embodiment 3, allowing for heat dissipation in an wider area. In addition, similar to Embodiment 1, Embodiment 7 results in a high-grade heat sink that does not require tight control at the time of manufacturing; is structurally simple; can be produced at a higher production rate; is cost-effective; and has sufficient sealability.

Embodiment 8

Figure 9:
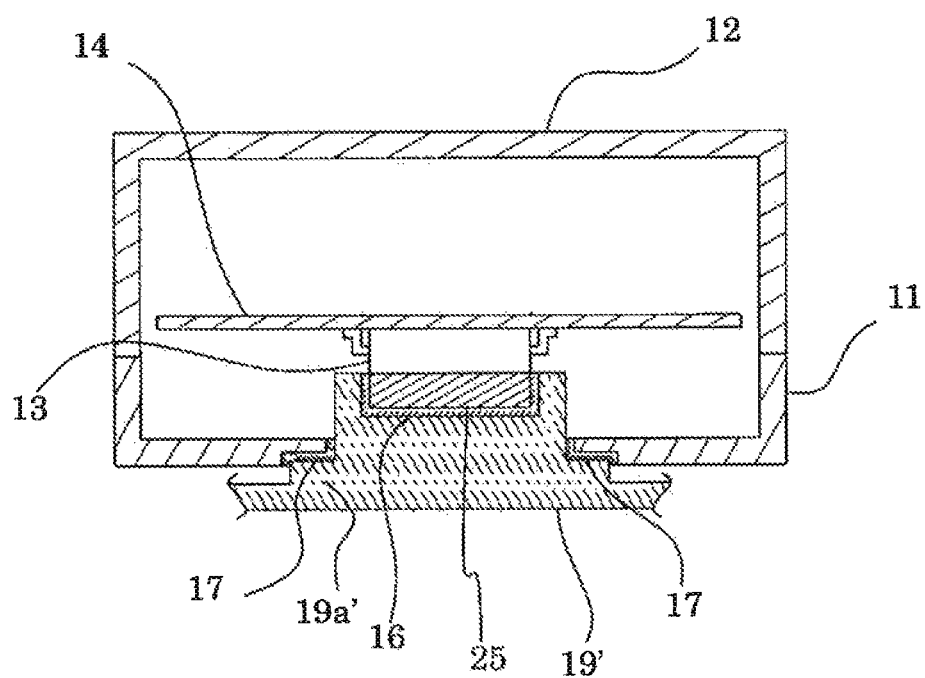
FIG. 9 is a cross-sectional side view illustrating the fundamental structure of an electronic control device according to Embodiment 8 of the invention.

FIG. 9 is a cross-sectional side view illustrating the fundamental structure of an electronic control device according to Embodiment 8 of the invention. The electronic control device of Embodiment 8 differs from that of Embodiment 7 shown in FIG. 8 in that the electronic component 13 on the circuit board 14 faces downward, as in Embodiment 2 shown in FIG. 3.

In the heat sink structure of the electronic control device of Embodiment 8 as well, a high-grade heat sink structure having sealability similar to that obtained Embodiment 7 can be obtained. Especially, since the heat of the electronic component 13 can be transferred directly to the heat sink block part 25 attached to the concave section of the metal block part 19', heat dissipating effects higher than those obtained in Embodiment 7 can be obtained.

Embodiment 9

Figure 10:
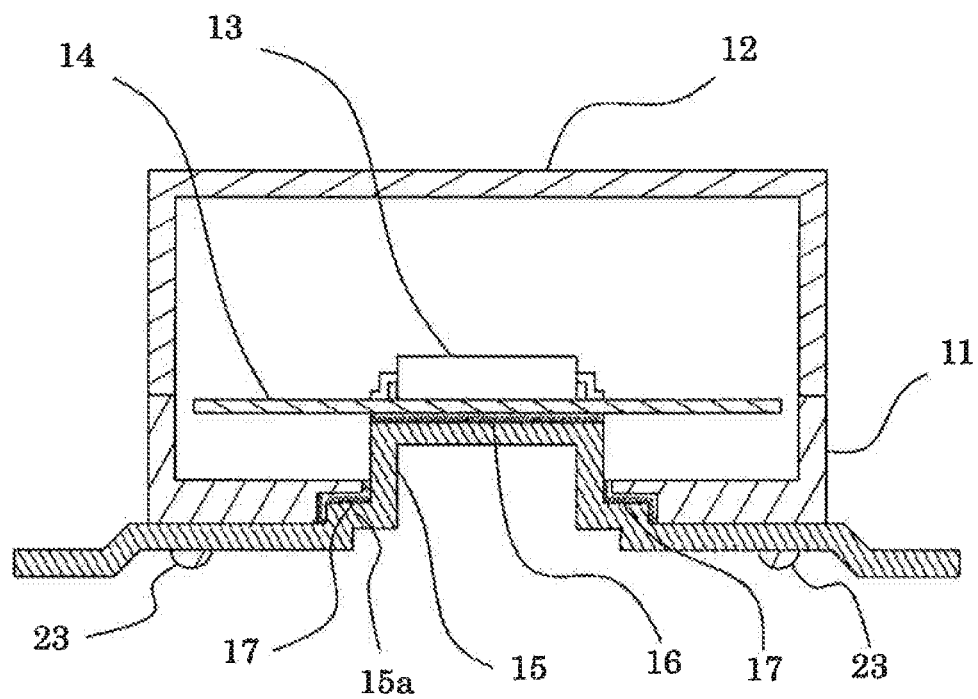
FIG. 10 is a cross-sectional side view illustrating the structure of fixing a metal part to the housing of an electronic control device according to Embodiment 9 of the invention.

FIG. 10 is a cross-sectional side view illustrating the structure of fixing metal part 15 to the housing of an electronic control device according to Embodiment 9 of the invention. The electronic control device of Embodiment 9 differs from that of Embodiment 1 shown in FIG. 1 in that it does not include the connector inserting section 18 used for an external mating connector and the partition wall 11a, in that the housing cover 12 on one side is attached to the housing base 11 not having the guide groove 11d on the other side to assemble the housing, and in that the metal part 15 includes a section for fixing itself to the housing base 11 with fastening members.

In the heat sink structure of the electronic control device of Embodiment 9, holes are punched at particular positions of the metal part 15 that come into contact with the housing base 11 and are slightly distanced from the opening 11c, and screw holes are provided in the positions of the housing base 11 corresponding to the positions of the holes. Fastening is performed with the use of caulking screws 23 which are the fasting members for fixing the metal part 15 and the housing base 11, whereby the metal part 15 is fixed to the housing cover 12 and the housing base 11. This results in a housing product having the metal part 15, which can be mounted in another device to facilitate heat transfer. It should be noted that the heat sink structure of Embodiment 9 can also be applied to a structure such as the one shown in FIG. 3 in which the circuit board 11 is placed upside down in the housing so that the electronic component 13 faces downward.

Embodiment 10

Figure 11:
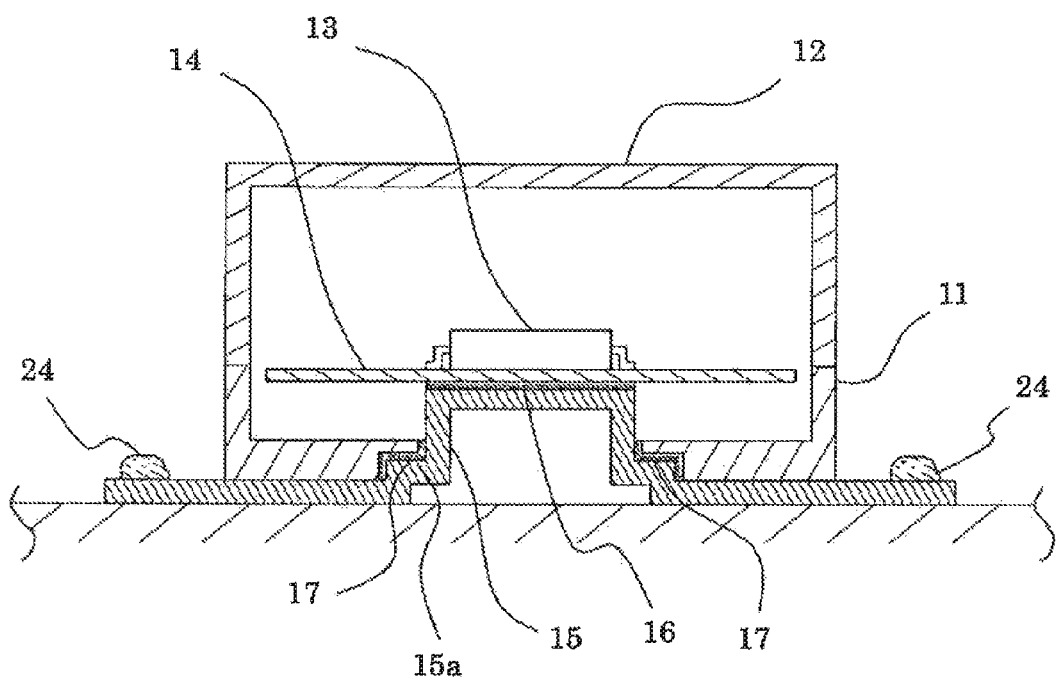
FIG. 11 is a cross-sectional side view illustrating the structure of fixing an electronic control device according to Embodiment 10 of the invention to an external member after a metal part is attached to the housing.

FIG. 11 is a cross-sectional side view illustrating the structure of fixing en electronic control device according to Embodiment 10 of the invention to an external member after the metal part 15 is attached to the housing. The electronic control device of Embodiment 10 differs from that of Embodiment 1 in that it does not include the connector inserting section 18 used for an external mating connector and the partition wall 11a, in that the housing cover 12 on one side is attached to the housing base 11 not having the guide groove 11d on the other side to assemble the housing, and in that the metal part 15 includes a section for fixing itself to an external member with fastening members after the metal part 15 is fixed to the housing.

In the heat sink structure of the electronic control device of Embodiment 10, holes are punched at particular positions of the metal part 15 that do not come into contact with the housing base 11 and are distanced from each other, and screw holes are provided in the positions of the external member corresponding to the positions of the holes. Fastening is performed with the use of screws 24 which are the fasting members for fixing the metal part 15 and the external member, whereby the metal part 15 fixed to the housing cover 12 and the housing base 11 can be fixed to the external member. This results in a housing product having the metal part 15, which can be mounted in another device to facilitate heat transfer. It should be noted that the heat sink structure of Embodiment 10 can also be applied to a structure such as the one shown in FIG. 3 in which the circuit board 14 is placed upside down in the housing so that the electronic component 13 faces downward.

DESCRIPTION OF REFERENCE CHARACTER

11: Housing base
11a, 26a: Partition wall
11b: Insertion hole
11c: Opening
11d: Guide groove
12: Housing cover
13: Electronic component
14: Board
15, 15': Metal part
15a, 15a', 19a, 19a': Flange
16: Heat dissipating filler material
17: Sealing filler material
18; Connector inserting section
19, 19': Metal block part
20: Heat sink plate
21: Filler material
22: Terminal
23: Caulking screw
24: Screw
25: Heat sink block part
26: Opening member

The invention claimed is:

1. An electronic control device housing a circuit board having an electronic component thereon in a housing of the device,
   wherein a wall surface of the housing facing a mounting position of the electronic component on the circuit board is partially open and a convex-shaped heat dissipating metal part having a flange on its bottom side is attached to the opening from outside, and
   wherein a top section of the metal part comes into contact with a position on the circuit board corresponding to the mounting position of the electronic component with a heat dissipating filler material placed therebetween when the metal part is attached from the opening of the housing and the flange and a wall section near the opening are brought into contact with each other with a sealing filler material placed therebetween.

2. The electronic control device of claim 1 wherein the housing is formed by attaching a housing on one side to a housing base on the other side.

3. The electronic control device of claim 1,
wherein the housing integrally includes via a partition wall a connector inserting section used for electrical connection with an external mating connector and
wherein part of the circuit board is inserted into an insertion hole provided in the partition wall so that it is exposed inside the connector inserting section.

4. The electronic control device of claim 1,
wherein the housing integrally includes via a partition wall a connector inserting section used for electrical connection with an external mating connector and
wherein distal ends of terminals are inserted into an insertion hole provided in the partition wall so that they are partially exposed inside the connector inserting section, and
wherein the other ends of the terminals are connected to a particular wiring pattern on the circuit board.

5. The electronic control device of claim 1 wherein the same material is used for the heat dissipating filler material and the sealing filler material.

6. The electronic control device of claim 1 wherein different materials are used for the heat dissipating filler material and the sealing filler material.

7. The electronic control device of claim 1,
wherein the housing includes:
a housing base integrally having the connector inserting section and the partition wall and being open on the edge side across from the partition wall; and
a housing cover attached to the opening on the edge side of the housing base, and
wherein the circuit board on which the electronic component is mounted is slid inside the housing base to insert an edge section of the circuit board into an insertion hole of the partition wall so that part of the circuit board is exposed inside the connector inserting section, the housing cover is then attached to the housing base, and the metal part is attached to the opening of the housing base provided for attachment of the metal part with the heat dissipating filler material and the sealing filler material placed therebetween.

8. The electronic control device of claim 7 wherein the housing cover is formed of metal.

9. The electronic control device of claim 1,
wherein the housing includes:
an opening member integrally having the connector inserting section and the partition wall;
a housing cover attached from above to a housing base in such a way as to sandwich a middle section of the opening and member; and
the housing base, and
wherein distal ends of the terminals are inserted into an insertion hole of the partition wall of the opening member to expose the distal ends of the terminals inside the connector inserting section, the other ends of the terminals are then connected to the wiring pattern on the circuit board having the electronic component thereon, the components are then positioned properly inside the housing base, the metal part is then attached to the opening of the housing base provided for attachment of the metal part with the heat dissipating filler material and the sealing filler material placed therebetween, and the housing cover is then attached to the housing base and the opening member.

10. The electronic control device of claim 1 wherein the metal part is formed by pressing or casting.

11. The electronic control device of claim 1 wherein a heat sink member is present between the heat dissipating filler material and the position on the circuit board corresponding to the mounting position of the electronic component or between the heat dissipating filler material and the electronic component.

12. The electronic control device of claim 11 wherein the heat sink member is a heat sink plate and attached with a plurality of adhesive filler materials at an adjacent position including terminals connected to the particular wiring pattern on the circuit board and at the position corresponding to the mounting position of the electronic component or at a position near the electronic component.

13. The electronic control device of claim 12 wherein the plurality of adhesive filler materials are made of a same material.

14. The electronic control device of claim 12 wherein the plurality of filler material are different materials depending on joint sections.

15. The electronic control device of claim 1 wherein the metal part includes a section for fixing the housing and the metal part together with fastening members.

16. The electronic control device of claim 1 wherein the metal part includes a section for fixing itself to an external member with fastening members after the metal part is attached to the housing.

17. The electronic control device of claim 1 wherein the housing is formed of resin.

18. An electronic control device housing a circuit board having an electronic component thereon in a housing of the device,
wherein a wall surface of the housing facing a mounting position of the electronic component on the circuit board is partially open and a convex-shaped heat dissipating metal part having a flange on its bottom side is attached to the opening from outside, and
wherein a top section of the metal part comes into contact with the electronic component on the circuit board with a heat dissipating filler material placed therebetween when the metal part is attached from the opening of the housing and the flange and a wall section near the opening are brought into contact with each other with a sealing filler material placed therebetween.

* * * * *